United States Patent
Pan et al.

(10) Patent No.: US 10,487,419 B2
(45) Date of Patent: Nov. 26, 2019

(54) PREPARATION METHOD AND APPLICATION OF SODIUM BARIUM FLUOROBORATE BIREFRINGENT CRYSTAL

(71) Applicant: XINJIANG TECHNICAL INSTITUTE OF PHYSICS AND CHEMISTRY, CHINESE ACADEMY OF SCIENCES, Urumqi, Xinjiang (CN)

(72) Inventors: Shilie Pan, Urumqi (CN); Hui Zhang, Urumqi (CN); Min Zhang, Urumqi (CN)

(73) Assignee: XINJIANG TECHNICAL INSTITUTE OF PHYSICS AND CHEMISTRY, CHINESE ACADEMY OF SCIENCE, Xinjiang (CN)

( * ) Notice: Subject to any disclaimer, the term of this patent is extended or adjusted under 35 U.S.C. 154(b) by 550 days.

(21) Appl. No.: 15/034,843

(22) PCT Filed: May 28, 2014

(86) PCT No.: PCT/CN2014/078643
§ 371 (c)(1),
(2) Date: May 5, 2016

(87) PCT Pub. No.: WO2015/067039
PCT Pub. Date: May 14, 2015

(65) Prior Publication Data
US 2016/0305041 A1    Oct. 20, 2016

(30) Foreign Application Priority Data
Nov. 6, 2013 (CN) .......................... 2013 1 0549626

(51) Int. Cl.
*C30B 29/22* (2006.01)
*C30B 29/12* (2006.01)
(Continued)

(52) U.S. Cl.
CPC .......... *C30B 29/22* (2013.01); *C01B 35/066* (2013.01); *C30B 15/10* (2013.01); *C30B 15/14* (2013.01);
(Continued)

(58) Field of Classification Search
CPC combination set(s) only.
See application file for complete search history.

(56) References Cited

U.S. PATENT DOCUMENTS 5,945,037 A * 8/1999 Ebbers .................. C01D 15/08
252/585

FOREIGN PATENT DOCUMENTS

CN        102677171    *    4/2015    ............. C30B 11/00

OTHER PUBLICATIONS

Burnett et al. Intrinsic birefringence in calcium fluoride and barium fluoride, Nov. 2001, Physics Review B., vol. 64, 241102(R), pp. 1-4.*
(Continued)

*Primary Examiner* — Erin F Bergner
(74) *Attorney, Agent, or Firm* — Lewis Roca Rothgerber Christie LLP (57) ABSTRACT

A preparation method and application of a $Na_3Ba_2(B_3O_6)_2F$ birefringent crystal, the crystal having a chemical formula of $Na_3Ba_2(B_3O_6)_2F$, and belonging to a hexagonal crystal system, the space group being $P6_3/m$, and the lattice parameters comprising a=7.3490(6) Å, c=12.6340(2) Å, V=590.93 (12) Å$^3$, Z=2; the crystal is used for an infrared/deep ultraviolet waveband, and is an uniaxial negative crystal, $n_e<n_o$, the transmission range being 175-3,350 nm, the
(Continued)

birefringence of 0.090 (3,350 nm)-0.240 (175 nm), and the crystal being grown by employing a melting method or a flux method; the crystal prepared via the method has a short growth cycle, high crystal quality and large crystal size, is easy to grow, cut, polish and store, is stable in the air, and difficult to deliquesce, and can be used for preparation of various polarization beam polarization beam splitter prism and infrared/deep ultraviolet waveband optical communication elements.

3 Claims, 3 Drawing Sheets (51) Int. Cl.
| | |
|---|---|
| *C01B 35/06* | (2006.01) |
| *C30B 15/10* | (2006.01) |
| *C30B 15/14* | (2006.01) |
| *C30B 15/22* | (2006.01) |
| *C30B 15/30* | (2006.01) |
| *C30B 17/00* | (2006.01) |
| *C30B 19/02* | (2006.01) |
| *C30B 19/06* | (2006.01) |
| *C30B 19/08* | (2006.01) |
| *C30B 19/10* | (2006.01) |
| *G02B 1/08* | (2006.01) |
| *G02B 5/30* | (2006.01) |
| *G02B 27/28* | (2006.01) |

(52) U.S. Cl.
CPC .............. *C30B 15/22* (2013.01); *C30B 15/30* (2013.01); *C30B 17/00* (2013.01); *C30B 19/02* (2013.01); *C30B 19/062* (2013.01); *C30B 19/067* (2013.01); *C30B 19/08* (2013.01); *C30B 19/10* (2013.01); *C30B 29/12* (2013.01); *G02B 1/08* (2013.01); *G02B 5/30* (2013.01); *G02B 27/283* (2013.01)

(56) References Cited

OTHER PUBLICATIONS

Translation of CN102677171.*

* cited by examiner

PREPARATION METHOD AND APPLICATION OF SODIUM BARIUM FLUOROBORATE BIREFRINGENT CRYSTAL

CROSS-REFERENCE TO RELEATED APPLICATIONS

This application is a National Phase Patent Application of International Patent Application Number PCT/CN2014/078643, filed on May 28, 2014, which claims priority of Chinese Patent Application Number 201310549626.3, filed on Nov. 6, 2013.

FIELD OF THE INVENTION

The present invention relates to a preparation method and application of a sodium barium fluoborate $Na_3Ba_2(B_3O_6)_2F$ birefringent crystal, particularly, to a preparation method and application of a sodium barium fluoborate birefringent crystal having a chemical formula of $Na_3Ba_2(B_3O_6)_2F$ which can be used in infrared/deep ultraviolet wavebands.

BACKGROUND OF THE INVENTION

Birefringence is one of the important features of light when propagating in an inhomogeneous medium crystal, and can be explained by the shear wave property of light. When light propagates in an inhomogeneous body (eg. a crystal other than those belonging to the cubic system), except for at a specific direction (along the direction of optical axis), it would change its vibration characteristics and is split into two polarized light beams having two electric field vectors of perpendicular vibration directions to each other, different propagation speeds and different refractive indexs. Such phenomenon is known as birefringence and such crystal is known as birefringent crystal. One of the two lights complies with the refraction law and is known as o-ray (ordinary ray), whose refractive index is represented by $n_o$; the other one does not comply with the refraction law and is known as e-ray (extraordinary ray), whose refractive index is represented by $n_e$. These two lights are both polarized lights. Due to anisotropy of the crystalline material, the angle between the two refracted lights is associated to the propagation direction and polarization state of the light. The crystals causing birefringence can be divided into uniaxial and biaxial crystals. The material called uniaxial crystal belongs to trigonal, tetragonal or hexagonal systems, and the material called biaxial crystal belongs to triclinic, monoclinic or orthorhombic systems. The easy-to-use birefringent material is uniaxial crystal. The characteristics of the birefringent crystal can be utilized to obtain linear polarized light in order to achieve light beam shift, so that the birefringent crystals are key materials for producing optoisolator, circulator, beam shifter, optical polarizer, optical modulator and other optical components.

Common birefringent materials are calcite crystal, rutile crystal, $LiNbO_3$ crystal, $YVO_4$ crystal, $\alpha$-$BaB_2O_4$ crystal and $MgF_2$ crystal, etc. However, the calcite crystal mainly exists in the natural form and is difficult to synthetize. Ordinary calcite crystal can be only used in the waveband above 350 nm rather than the ultraviolet region. Besides, the general size of the calcite crystal is relatively small and the impurity content is relatively high, which cannot meet the requirements of large-size optical polarization components. Moreover, it is easy to cleave and difficult to process, resulting in poor crystal utilization. The rutile crystal also exists in the natural form and is difficult to synthetize. Moreover, the rutile crystal is relatively small in size and high in hardness and therefore is difficult to process. For $LiNbO_3$, it is easy to get large-size crystals, but the birefringence index is too small. $YVO_4$ is an excellent artificial birefringent crystal in performance, but its transmission range is 400-5,000 nm so it cannot be used in ultraviolet region. In addition, due to its high melting point, the $YVO_4$ crystal must be grown in an iridium crucible in the manner of Czochralski growth as well as at a weak oxygen atmosphere. Thus, there is a problem of valence change in iridium during the crystal growth, which results in a decline in crystal quality and makes it difficult to obtain high-quality crystals. $\alpha$-$BaB_2O_4$ can easily crack during the crystal growth due to solid-state phase change. $MgF_2$ crystal has a transmission range of 110-8,500 nm and is a potential candidate for application in deep ultraviolet region, but its birefringence index is too small to be suitable for Glan prism and can only be used to make Rochon prism. Moreover, it has a small walk-off angle, which will make the device size too large to be used. The $Na_3Ba_2(B_3O_6)_2F$ birefringent crystal provided in the present invention has not only a wide transmission range (175-3,350 nm) but also a large birefringence index (0.090-0.240), and can be used in deep ultraviolet waveband (175-350 nm).

In 2009, T. B. Bekker et al. (The Russian Federation) discovered $Na_3Ba_2(B_3O_6)_2F$ during exploration of growing $\beta$-$BaB_2O_4$ by the flux method and also reported the crystal structure: the crystal belonging to the hexagonal system, having a space group $P6_3/m$, with lattice parameters of a=7.3490(6) Å, c=12.6340(2) Å, V=590.93(12) Å$^3$, Z=2. Meanwhile, the crystal was grown for 52 days by taking NaF or $BaF_2$ as a flux and the relevant reports were published in Journal of Crystal Growth and other journals. However, there are no relevant reports about growth of the $Na_3Ba_2(B_3O_6)_2F$ crystal by the melt method or its birefringence index etc.

There are two major disadvantages for growing crystals by using the flux method: firstly, it takes a long cycle to grow the crystal, generally more than 30 days, so the growth efficiency is low; secondly, addition of the flux may introduce impurities into the crystal, which has negative effects on the optical quality of the crystal. Therefore, we employed the melt method to grow the $Na_3Ba_2(B_3O_6)_2F$ crystal according to its stoichiometric ratio without adding any flux to obtain the desired $Na_3Ba_2(B_3O_6)_2F$ crystal in 1-3 days, which is of high quality, without cracks or wrappages. Thus it can be seen that growing the crystal by the melt method not only greatly improves the growth efficiency but also ensure the optical quality, which is more suitable for large-scale growth of the $Na_3Ba_2(B_3O_6)_2F$ birefringent crystal.

By utilizing the resulting crystal, we characterized its refractive indexes for the first time and thereby obtained its birefringence indexes. We also characterized the transmission spectrum, based on which we proposed that $Na_3Ba_2(B_3O_6)_2F$ can be used as a birefringent crystal from infrared to deep ultraviolet wavebands and play an important role in the optical and communication fields. It could be used to produce optical polarization beam splitter prisms and infrared-deep ultraviolet optical communication components, including Glan prism, Wollaston prism, Rochon prism, beam splitting polarizer, as well as optoisolator, circulator, beam shifter, optical polarizer, optical modulator, optical polarizer, polarization beam splitter, phase retardation device, electro-optic modulation device and the like.

SUMMARY OF THE INVENTION

One objective of the present invention is to provide a $Na_3Ba_2(B_3O_6)_2F$ birefringent crystal, which has a chemical formula of $Na_3Ba_2(B_3O_6)_2F$ and a molecular weight of 459.37, belongs to the hexagonal system, has a space group $P6_3/m$ with lattice parameters of a=7.3490(6) Å, c=12.6340 (2) Å, V=590.93(12) Å$^3$, and Z=2, has a wide transmission range of 175-3,350 nm and a large birefringence index of 0.090-0.240, and can be used in ultraviolet and deep ultraviolet wave bands (175-350 nm).

Another objective of the present invention is to provide a method for preparing the $Na_3Ba_2(B_3O_6)_2F$ birefringent crystal.

Yet another objective of the present invention is to provide an application of the $Na_3Ba_2(B_3O_6)_2F$ birefringent crystal.

The invention provides a method for preparing the sodium barium fluoborate birefringent crystal, wherein the crystal is grown by the melt method including the top seeding method, the Kyropoulos method or the Czochralski method, according to the specific steps as follows:

a. Mixing and grinding the sodium-containing compound, barium-containing compound, boron-containing compound and fluorine-containing compound at a molar ratio of sodium:barium:boron:fluorine=3:2:6:1, charging the mixture into a platinum crucible, heating the mixture to a temperature higher than 820° C. to obtain a high-temperature mixed melt, and maintaining this temperature for 1-100 hours;

b. Growing the crystal on the surface or inside the melt: decreasing the temperature of the mixed melt of Step (a) to 820-825° C., fixing a seed crystal to a seed crystal rod and preheating the seed crystal above the melt for 1-100 minutes, then decreasing the temperature of the mixed melt to 810-820° C., descending the seed crystal onto the surface of or into the mixed melt while rotating the seed crystal or the crucible at a rotation speed of 0-100 r/min, and increasing or decreasing the temperature of the mixed melt at a rate of 0-±5° C./d and meanwhile drawing the crystal at a speed of 0-15 mm/h;

c. When growing the monocrystal to a desired size, increasing the drawing speed so as to draw the crystal out of the melt liquid surface, decreasing the temperature to room temperature at a rate of 1-100° C./h, and then taking the crystal out of the furnace slowly to obtain a $Na_3Ba_2(B_3O_6)_2F$ birefringent crystal;

In Step (a), the sodium-containing compound is 99.9% pure sodium oxide, sodium hydroxide, sodium carbonate, sodium nitrate or sodium metaborate; the barium-containing compound is 99.9% pure barium oxide, barium hydroxide, barium fluoride, barium carbonate or barium nitrate; the boron-containing compound is 99.9% pure boric acid or boron oxide; and the fluorine-containing compound is 99.9% pure sodium fluoride or barium fluoride.

The sodium barium fluoborate birefringent crystal obtained by the preparation method of the present invention is a negative uniaxial crystal, $n_e<n_o$, having a birefringence index of 0.090-0.240 and a transmission range of 175-3,350 nm.

Provided is a use of the sodium barium fluoborate birefringent crystal obtained by the preparation method of the present invention in preparing polarization beam splitter prisms or infrared-deep ultraviolet optical communication components.

Said polarization beam splitter prisms include Gran prism, Wollaston prism, Rochon prism or beam splitting polarizer.

Said optical communication components include optoisolator, circulator, beam shifter, optical polarizer, optical modulator, optical polarizer, polarization beam splitter, phase retardation device or electro-optic modulator.

The reaction equations for preparing $Na_3Ba_2(B_3O_6)_2F$ are as follows:

$NaF+Na_2CO_3+2BaCO_3+6H_3BO_3 \rightarrow Na_3Ba_2(B_3O_6)_2F+CO_2\uparrow+H_2O\uparrow$;

$NaF+2NaOH+2BaCO_3+6H_3BO_3 \rightarrow Na_3Ba_2(B_3O_6)_2F+CO_2\uparrow+H_2O\uparrow$;

$NaF+2NaCl+2BaCO_3+6H_3BO_3 \rightarrow Na_3Ba_2(B_3O_6)_2F+CO_2\uparrow H_2O\uparrow+HCl\uparrow$;

$NaF+2NaBr+2BaCO_3+6H_3BO_3 \rightarrow Na_3Ba_2(B_3O_6)_2F+CO_2\uparrow+H_2O\uparrow+HBr\uparrow$;

$NaF+2NaO+2Ba(NO_3)_2+6H_3BO_3 \rightarrow Na_3Ba_2(B_3O_6)_2F+NO_2\uparrow+H_2O\uparrow$;

$NaF+Na_2CO_3+2BaO+6H_3BO_3+0.6BaF_2 \rightarrow Na_3Ba_2(B_3O_6)_2F+CO_2\uparrow+H_2O\uparrow+HF\uparrow$

$NaF+Na_2CO_3+2Ba(OH)_2+6H_3BO_3+0.4B_2O_3 \rightarrow Na_3Ba_2(B_3O_6)_2F+CO_2\uparrow+H_2O\uparrow$;

$NaF+Na_2CO_3+2BaCl_2+6H_3BO_3+NaCl \rightarrow Na_3Ba_2(B_3O_6)_2F+CO_2\uparrow+H_2O\uparrow+HCl\uparrow$;

$NaF+Na_2CO_3+2BaBr_2+6H_3BO_3+2NaBO_2 \rightarrow Na_3Ba_2(B_3O_6)_2F+CO_2\uparrow+H_2O\uparrow+HBr\uparrow$;

$NaF+Na_2CO_3+2BaBr_2+6H_3BO_3+2.5NaNO_3 \rightarrow Na_3Ba_2(B_3O_6)_2F+CO_2\uparrow+H_2O\uparrow+HBr\uparrow+NO_2\uparrow$;

$NaF+Na_2CO_3+2BaBr_2+6H_3BO_3+3NaBr \rightarrow Na_3Ba_2(B_3O_6)_2F+CO_2\uparrow+H_2O\uparrow+HBr\uparrow$;

$NaF+Na_2CO_3+2BaBr_2+6H_3BO_3+2NaBr \rightarrow Na_3Ba_2(B_3O_6)_2F+CO_2\uparrow+H_2O\uparrow+HBr\uparrow$;

$NaF+Na_2CO_3+2BaBr_2+6H_3BO_3+4NaBO_2 \rightarrow Na_3Ba_2(B_3O_6)_2F+CO_2\uparrow+H_2O\uparrow T+HBr\uparrow$;

$NaF+Na_2CO_3+2BaO+6H_3BO_3+BaF_2 \rightarrow Na_3Ba_2(B_3O_6)_2F+CO_2\uparrow+H_2O\uparrow+HF\uparrow$.

The sodium barium fluoborate birefringent crystal of the present invention has a chemical formula of $Na_3Ba_2(B_3O_6)_2F$ and a molecular weight of 459.37, belongs to the hexagonal system, has a space group of $P6_3/m$, with lattice parameters of a=7.3490(6) Å, c=12.6340(2) Å, V=590.93(12) Å$^3$ and Z=2, and it is a negative uniaxial crystal, $n_e<n_o$, with a transmission range of 175-3,350 nm and a birefringence index of 0.090 (3350 nm)-0.240 (175 nm); the crystal is easy to grow, cut, polish and reserve, and it is stable in air, not easy to become deliquescent and insoluble in water. In the preparation method adopting the stoichiometric high-temperature mixed melt method (comprising the top seeding method, the Kyropoulos method and the Czochralski method), the crystal obtained is transparent, easy to cut, grind, polish and reserve, stable in air, not easy to become deliquescent and insoluble in water. The crystal can be used in producing polarization beam splitter prisms such as Gran prism, Wollaston prism, Rochon prism or beam splitting polarizer etc. and optical communication components such as optoisolator, circulator, beam shifter, optical polarizer, optical modulator, optical polarizer, polarization beam splitter, phase retardation device and electro-optic modulation device, and plays an important role in the optical and communication fields.

BRIEF DESCRIPTION OF THE DRAWINGS

wherein 1 is incident light, 2 is o-ray, 3 is e-ray, 4 is an optical axis, and 5 is the $Na_3Ba_2(B_3O_6)_2F$ crystal, 6 is the transmission direction of the light, and 7 is an optic-axial plane.

EXAMPLES

Example 1

Growing the $Na_3Ba_2(B_3O_6)_2F$ birefringent crystal by the top seeding method from the stoichiometric melt The $Na_3Ba_2(B_3O_6)_2F$ crystal was prepared according to the following reaction equation:

wherein the raw materials used (analytically pure) were: NaF 25.194 g, $Na_2CO_3$ 63.597 g, $BaCO_3$ 236.832 g and $H_3BO_3$ 222.616 g (the molar ratio of Na:Ba:B:F was 3:2:6:1), and the method comprises the following steps:

The weighed raw materials were mixed and grounded in a mortar, and then charged into a Φ 100 mm×100 mm platinum crucible, the obtained mixture was heated to a temperature of 830° C. to obtain a mixed melt, followed by maintaining this temperature for 48 hours;

The crystal was grown on the surface of the mixed melt: the temperature of the mixed melt was firstly decreased to 821° C., a seed crystal was then fixed to a seed crystal rod and preheated at a distance of 0-10 mm above the melt for 30 minutes; then the temperature of the mixed melt was decreased to 819-820° C. and the seed crystal was descended onto the surface of the mixed melt while rotating the seed crystal at a rate of 15 r/min, decreasing the temperature of the mixed melt at a rate of 0-0.3° C./d, and meanwhile drawing the crystal up at a speed of 0-15 mm/h;

After 3 days when the monocrystal was grown up to a desired size, the drawing speed was increased so as to draw the crystal out of the melt liquid surface; the temperature of the furnace was decreased to room temperature at a rate of 5-25° C./h, and then the crystal was taken out of the furnace slowly to obtain a transparent 50×31×12 mm³ sodium barium fluoborate birefringent crystal. The obtained crystal was subjected to a light transmission measurement and the results showed that it had a transmission range of 175-3,350 nm and a birefringence index of 0.090-0.240.

The crystal grown according to this method had a significantly shortened growth cycle and much better quality, without wrappages or cracks.

Example 2

Growing the $Na_3Ba_2(B_3O_6)_2F$ Birefringent Crystal by the Kyropoulos Method from the Stoichiometric Melt The $Na_3Ba_2(B_3O_6)_2F$ crystal was prepared according to the following reaction equation:

wherein the raw materials used (analytically pure) were: NaF 25.194 g, $Na_2CO_3$ 63.597 g, $BaCO_3$ 236.832 g and $H_3BO_3$ 222.616 g (the molar ratio of Na:Ba:B:F was 3:2:6:1), and the method comprises the following steps:

The weighed raw materials were mixed and grounded in a mortar, and then charged into a Φ 100 mm×100 mm platinum crucible, the obtained mixture was heated to a temperature of 830° C. to obtain a mixed melt, followed by maintaining this temperature for 48 hours;

The crystal was grown in the mixed melt: the temperature of the mixed melt was firstly decreased to 821° C., a seed crystal was then fixed to a seed crystal rod and preheated at a distance of 0-10 mm above the melt for 30 minutes; then the temperature of the mixed melt was decreased to 819-820° C. and the seed crystal was descended into the mixed melt while rotating the seed crystal at a rate of 10 r/min, decreasing the temperature of the mixed melt at a rate of 0-0.3° C./d, and meanwhile drawing the crystal up at a speed of 0-15 mm/h;

After 2.5 days when the monocrystal was grown up to a desired size, the drawing speed was increased so as to draw the crystal out of the melt liquid surface; the temperature of the furnace was decreased to room temperature at a rate of 5-25° C./h, and then the crystal was taken out of the furnace slowly to obtain a transparent 40×35×13 mm³ sodium barium fluoborate birefringent crystal. The obtained crystal was subjected to a light transmission measurement and the results showed that it had a transmission range of 175-3,350 nm and a birefringence index of 0.090-0.240.

The crystal grown according to this method had a significantly shortened growth cycle and much better quality, without wrappages or cracks, and in the meantime the obtained crystal had a further increase in thickness, which facilitate further process and application.

Example 3

Growing the $Na_3Ba_2(B_3O_6)_2F$ Birefringent Crystal by the Czochralski Method from the Stoichiometric Melt The $Na_3Ba_2(B_3O_6)_2F$ crystal was prepared according to the following reaction equation:

wherein the raw materials used (analytically pure) were: NaF 25.194 g, $Na_2CO_3$ 63.597 g, $BaCO_3$ 236.832 g and $H_3BO_3$ 222.616 g (the molar ratio of Na:Ba:B:F was 3:2:6:1), the method comprises the following steps:

The weighed raw materials were mixed and grounded in a mortar, and then charged into a Φ 100 mm×100 mm platinum crucible, the obtained mixture was heated to a temperature of 830° C. to obtain a mixed melt, followed by maintaining this temperature for 48 hours;

The temperature of the mixed melt was decreased to 821° C., a seed crystal was then fixed to a seed crystal rod and preheated at a distance of 0-10 mm above the melt for 30 minutes; then the temperature of the mixed melt was decreased to 819-820° C. and the seed crystal was descended onto the surface of the mixed melt while rotating the seed crystal at a rate of 10 r/min and meanwhile drawing the crystal up at a speed of 0-1 mm/h; when the crystal started to grow, the process of shouldering and necking was performed to further optimize the quality of the seed crystal; the drawing speed was kept at 2 mm/h and the mixed melt was cooled at a rate of 0-0.3° C./d, allowing the crystal to grow continuously at a constant diameter.

After 1.5 days when the monocrystal was grown up to a desired size, the drawing speed was increased so as to draw the crystal out of the melt liquid surface; the temperature of the furnace was decreased to room temperature at a rate of 5-25° C./h, and then the crystal was taken out of the furnace slowly to obtain a transparent 42×42×32 mm³ sodium barium fluoborate birefringent crystal. The obtained crystal subjected to a light transmission measurement and the results showed that it had a transmission range of 175-3,350 nm and a birefringence index of 0.090-0.240.

The crystal grown according to this method had a further shortened growth cycle and a further increased thickness, and the crystal was transparent, without wrappages or cracks. This method further facilitated fast growth of large and thick optical-quality monocyrstal.

Example 4

Growing $Na_3Ba_2(B_3O_6)_2F$ by the Flux Method

The $Na_3Ba_2(B_3O_6)_2F$ crystal was prepared according to the following reaction equation:

wherein the raw materials used (analytically pure) were: NaF 25.194 g, $Na_2CO_3$ 63.597 g, BaO 184.008 g, $H_3BO_3$ 222.616 g and $BaF_2$ 63.115 g (the molar ratio of Na:Ba:B:F:$BaF_2$ was 3:2:6:1:0.6, that is, the molar ratio of $Na_3Ba_2(B_3O_6)_2F$ to $BaF_2$ was 1:0.6), and the method comprised the following steps:

The weighed raw materials were mixed and grounded in a mortar, and then charged into a Φ 100 mm×100 mm platinum crucible, the obtained mixture was heated to 820° C. to obtain a mixed melt, followed by maintaining this temperature for 30 hours;

The mixed melt comprising the flux was cooled to 790° C.; a seed crystal was fixed to a seed crystal rod and then descended from the top of a furnace into the mixed melt, while rotating the seed crystal rod at a rate of 15 r/min, slowly cooling the mixed melt at a rate of 0.2° C./d, and meanwhile drawing the crystal up at a speed of 0-15 mm/h;

After the monocrystal was grown up to a desired size, the drawing speed was increased so as to draw the crystal out of the melt liquid surface; the temperature of the furnace was decreased to room temperature at a rate of 5° C./h, and then the crystal was taken out of the furnace slowly to obtain a 30×23×6 mm³ sodium barium fluoborate birefringent crystal.

Example 5

Growing $Na_3Ba_2(B_3O_6)_2F$ by the Flux Method

The $Na_3Ba_2(B_3O_6)_2F$ crystal was prepared according to the following reaction equation:

wherein the raw materials (analytically pure) used were: NaF 25.194 g, $Na_2CO_3$ 63.597 g, $Ba(OH)_2$ 205.620 g, $H_3BO_3$ 222.616 g and $B_2O_3$ 16.708 g (the molar ratio of Na:Ba:B:F:$B_2O_3$ was 3:2:6:1:0.4, that is, the molar ratio of $Na_3Ba_2(B_3O_6)_2F$ to $B_2O_3$ was 1:0.4), and the method comprised the following steps:

The weighed raw materials were mixed and grounded in a mortar, and then charged into a Φ 100 mm×100 mm platinum crucible, the obtained mixture was heated to 820° C. to obtain a mixed melt, followed by maintaining this temperature for 25 hours;

The mixed melt comprising the flux was cooled to 787° C.; a seed crystal was fixed to a seed crystal rod and then descended from the top of a furnace onto the surface of the mixed melt, while rotating the seed crystal rod at a rate of 35 r/min, slowly cooling the mixed melt at a rate of 0.1° C./d, and meanwhile drawing the crystal up at a speed of 0-15 mm/h;

After the monocrystal was grown up to a desired size, the drawing speed was increased so as to draw the crystal out of the melt liquid surface; the temperature of the furnace was decreased to room temperature at a rate of 8° C./h, and then the crystal was taken out of the furnace slowly to obtain a 23×18×6 mm³ sodium barium fluoborate birefringent crystal.

Example 6

Growing $Na_3Ba_2(B_3O_6)_2F$ by the Flux Method

The $Na_3Ba_2(B_3O_6)_2F$ crystal was prepared according to the following reaction equation:

wherein the raw materials used (analytically pure) were: NaF 25.194 g, $Na_2CO_3$ 63.597 g, $BaCl_2$ 249.984 g, $H_3BO_3$ 222.616 g and NaCl 35.064 g (the molar ratio of Na:Ba:BT:NaCl is 3:2:6:1:1, that is, the molar ratio of $Na_3Ba_2(B_3O_6)_2F$ to NaCl was 1:1), and the method comprised the following steps:

The weighed raw materials were mixed and grounded in a mortar, and then charged into a Φ 100 mm×100 mm platinum crucible, the obtained mixture was heated to 820° C. to obtain a mixed melt, followed by maintaining this temperature for 30 hours;

The mixed melt comprising the flux was cooled to 782° C.; a seed crystal was fixed to a seed crystal rod and then descended from the top of a furnace into the mixed melt, while rotating the seed crystal rod at a rate of 30 r/min, cooling the mixed melt slowly at a rate of 0.5° C./d, and meanwhile drawing the crystal up at a speed of 0-15 mm/h.

After the monocrystal was grown up to a desired size, the drawing speed was increased so as to draw the crystal out of the melt liquid surface; the temperature of the furnace was decreased to room temperature at a rate of 5° C./h, and then the crystal was taken out of the furnace slowly to obtain a 16×15×6 mm³ sodium barium fluoborate birefringent crystal.

Example 7

Growing Na₃Ba₂(B₃O₆)₂F by the Flux Method

The $Na_3Ba_2(B_3O_6)_2F$ crystal was prepared according to the following reaction equation:

$$NaF+Na_2CO_3+2BaBr_2+6H_3BO_3+2NaBO_2 \rightarrow Na_3Ba_2(B_3O_6)_2F+CO_2\uparrow+H_2O\uparrow+HBr\uparrow$$

wherein the raw materials (analytically pure) used were: NaF 25.194 g, Na₂CO₃ 63.597 g, BaBr₂ 356.028 g, H₃BO₃ 222.616 g and NaBO₂ 78.960 g (the molar ratio of Na:Ba:B:F:NaBO₂ was 3:2:6:1:2, that is, the molar ratio of $Na_3Ba_2(B_3O_6)_2F$ to NaBO₂ was 1:2), and the method comprised the following steps:

The weighed raw materials were mixed and grounded in a mortar, and then charged into a Φ 100 mm×100 mm platinum crucible, the obtained mixture was heated to 820° C. to obtain a mixed melt, followed by maintaining this temperature for 24 hours;

The mixed melt liquid comprising the flux was cooled to 753° C., a seed crystal was fixed to a seed crystal rod and then descended from the top of a furnace into the mixed melt, while rotating the seed crystal rod at a rate of 35 r/min, slowly cooling the mixed melt at a rate of 0.5° C./d, and meanwhile drawing the crystal up at a speed of 0-15 mm/h;

After the monocrystal was grown up to a desired size, the drawing speed was increased so as to draw the crystal out of the melt liquid surface; the temperature of the furnace was decreased to room temperature at a rate of 5° C./h, and then the crystal was taken out of the furnace slowly to obtain a 27×16×8 mm³ sodium barium fluoborate birefringent crystal.

Example 8

Growing the Na₃Ba₂(B₃O₆)₂F by the Flux Method

The $Na_3Ba_2(B_3O_6)_2F$ crystal was prepared according to the following reaction equation:

$$NaF+Na_2CO_3+2BaBr_2+6H_3BO_3+2.5NaNO_3 \rightarrow Na_3Ba_2(B_3O_6)_2F+CO_2\uparrow HBr\uparrow+NO_2\uparrow$$

wherein the raw materials (analytically pure) used were: NaF 25.194 g, Na₂CO₃ 63.597 g, BaBr₂ 356.028 g, H₃BO₃ 222.616 g and NaNO₃ 127.485 g (the molar ratio of Na:Ba:B:F:NaNO₃ was 3:2:6:1:2.5, that is, the molar ratio of $Na_3Ba_2(B_3O_6)_2F$ to NaNO₃ was 1:2.5), and the method comprised the following steps:

The weighed raw materials were mixed and grounded in a mortar, and then charged into a Φ 100 mm×100 mm platinum crucible, the obtained mixture was heated to 820° C. to obtain a mixed melt, followed by maintaining this temperature for 24 hours;

The mixed melt comprising the flux was cooled to 790° C.; a seed crystal was fixed to a seed crystal rod and then descended from the top of a furnace into the mixed melt, while rotating the seed crystal rod at a rate of 20 r/min, slowly cooling the mixed melt at a rate of 0.5° C./d, and meanwhile drawing the crystal up at a speed of 0-15 mm/h.

After the monocrystal was grown up to a desired size, the drawing speed was increased so as to draw the crystal out of the melt liquid surface; the temperature of the furnace was decreased to room temperature at a rate of 5° C./h, and then the crystal was taken out of the furnace slowly to obtain a 32×24×9 mm³ sodium barium fluoborate birefringent crystal.

Example 9

Growing the NBBF Birefringent Crystal with Flux

The $Na_3Ba_2(B_3O_6)_2F$ crystal was prepared according to the following reaction equation:

$$NaF+Na_2CO_3+2BaBr_2+6H_3BO_3+3NaBr \rightarrow Na_3Ba_2(B_3O_6)_2F+CO_2\uparrow+H_2O\uparrow+HBr\uparrow$$

wherein the raw materials (analytically pure) used were: NaF 25.194 g, Na₂CO₃ 63.597 g, BaBr₂ 356.028 g, H₃BO₃ 222.616 g and NaBr 185.202 g (the molar ratio of Na:Ba:B:F:NaBr is 3:2:6:1:3, that is, the molar ratio of $Na_3Ba_2(B_3O_6)_2F$ to NaBr was 1:3), and the method comprised the following steps:

The weighed raw materials were mixed and grounded in a mortar, and then charged into a Φ 100 mm×100 mm platinum crucible, the obtained mixture was heated to 820° C. to obtain a mixed melt, followed by maintaining this temperature for 24 hours;

The mixed melt comprising the flux was cooled to 747° C.; a seed crystal was fixed to a seed crystal rod and then descended from the top of a furnace onto the surface of the mixed melt, while rotating the seed crystal rod at a rate of 15 r/min and slowly cooling the mixed melt at a rate of 0.2° C./d and meanwhile drawing the crystal up at a speed of 0-15 mm/h.

After the monocrystal was grown up to a desired size, the drawing speed was increased so as to draw out of the melt liquid surface; the temperature of the furnace was decreased to room temperature at a rate of 5° C./h, and then the crystal was taken out of the furnace slowly to obtain a 35×23×10 mm³ sodium barium fluoborate birefringent crystal.

Example 10

Growing Na₃Ba₂(B₃O₆)₂F by the Flux Method

The $Na_3Ba_2(B_3O_6)_2F$ crystal was prepared according to the following reaction equation:

$$NaF+Na_2CO_3+2BaBr_2+6H_3BO_3+2NaBr \rightarrow Na_3Ba_2(B_3O_6)_2F+CO_2\uparrow+H_2O\uparrow+HBr\uparrow$$

wherein the raw materials (analytically pure) used were: NaF 25.194 g, Na₂CO₃ 63.597 g, BaBr₂ 356.028 g, H₃BO₃ 222.616 mg and NaBr 123.468 g (the molar ratio of Na:Ba:B:F:NaBr was 3:2:6:1:2, that is, the molar ratio of $Na_3Ba_2(B_3O_6)_2F$ to NaBr was 1:2), and the method comprises the following steps:

The weighed raw materials were mixed and grounded in a mortar, and then charged into a Φ 100 mm×100 mm platinum crucible, the obtained mixture was heated to 820° C. to obtain a mixed melt, followed by maintaining this temperature for 30 hours;

The mixed melt comprising the flux was cooled to 772° C.; a seed crystal was fixed to a seed crystal rod and then descended from the top of a furnace into the mixed melt, while rotating the seed crystal rod at a rate of 20 r/min, slowly cooling the mixed melt at a rate of 0.4° C./d, and meanwhile drawing the crystal up at a speed of 0-15 mm/h;

After the monocrystal was grown up to a desired size, the drawing speed was increased so as to draw the crystal out of the melt liquid surface; the temperature of the furnace was decreased to room temperature at a rate of 5° C./h, and then the crystal was taken out of the furnace slowly to obtain a 23×15×6 mm³ sodium barium fluoborate birefringent crystal.

Example 11

Growing $Na_3Ba_2(B_3O_6)_2F$ by the Flux Method

The $Na_3Ba_2(B_3O_6)_2F$ crystal was prepared according to the following reaction equation:

wherein the raw materials (analytically pure) used were: NaF 25.194 g, $Na_2CO_3$ 63.597 g, $BaBr_2$ 356.028 g, $H_3BO_3$ 222.616 g and $NaBO_2$ 157.920 g (the molar ratio of Na:Ba:B:F:$NaBO_2$ was 3:2:6:1:4, that is, the molar ratio of $Na_3Ba_2(B_3O_6)_2F$ to $NaBO_2$ was 1:4), and the method comprised the following steps:

The weighed raw materials were mixed and grounded in a mortar, and then charged into a Φ 100 min×100 mm platinum crucible, the obtained mixture was heated to 820° C. to obtain a mixed melt, followed by maintaining this temperature for 24 hours;

The mixed melt comprising the flux was cooled to 724° C.; a seed crystal was fixed to a seed crystal rod and then descended from the top of a furnace into the mixed melt, while rotating the seed crystal rod at a rate of 45 r/min, slowly cooling the mixed melt at a rate of 0.3° C./d, and meanwhile drawing the crystal up at a speed of 0-15 mm/h;

After the monocrystal was grown up to a desired size, the drawing speed was increased so as to draw the crystal out of the melt liquid surface; the temperature of the furnace was decreased to room temperature at a rate of 5° C./h, and then the crystal was taken out of the furnace slowly to obtain a 32×24×12 mm³ sodium barium fluoborate birefringent crystal.

Example 12

Grow $Na_3Ba_2(B_3O_6)_2F$ by the Flux Method

The $Na_3Ba_2(B_3O_6)_2F$ crystal was prepared according to the following reaction equation:

wherein the raw materials (analytically pure) used were: NaF 25.194 g, $Na_2CO_3$ 63.597 g, BaO 184.008 g, $H_3BO_3$ 222.616 g and $BaF_2$ 105.192 g (the molar ratio of Na:Ba:B:F:$BaF_2$ was 3:2:6:1:1, that is, the molar ratio of $Na_3Ba_2(B_3O_6)_2F$ to $BaF_2$ was 1:1), and the method comprised the following steps:

The weighed raw materials were mixed and grounded in a mortar, and then charged into a Φ 100 mm×100 mm platinum crucible, the obtained mixture was heated to 820° C. to obtain a mixed melt, followed by maintaining this temperature for 30 hours;

The mixed melt comprising the flux was cooled to 772° C.; a seed crystal was fixed to a seed crystal rod and then descended from the top of a furnace into the mixed melt, while rotating the seed crystal rod at a rate of 10 r/min, slowly cooling the mixed melt at a rate of 0.3° C./d, and meanwhile drawing the crystal up at a speed of 0-15 mm/h;

After the monocrystal was grown up to a desired size, the drawing speed was increased so as to draw the crystal out of the melt liquid surface; the temperature of the furnace was decreased to room temperature at a rate of 5° C./h, and then the crystal was taken out of the furnace slowly to obtain a 43×28×13 mm³ sodium barium fluoborate birefringent crystal.

Figure 1:
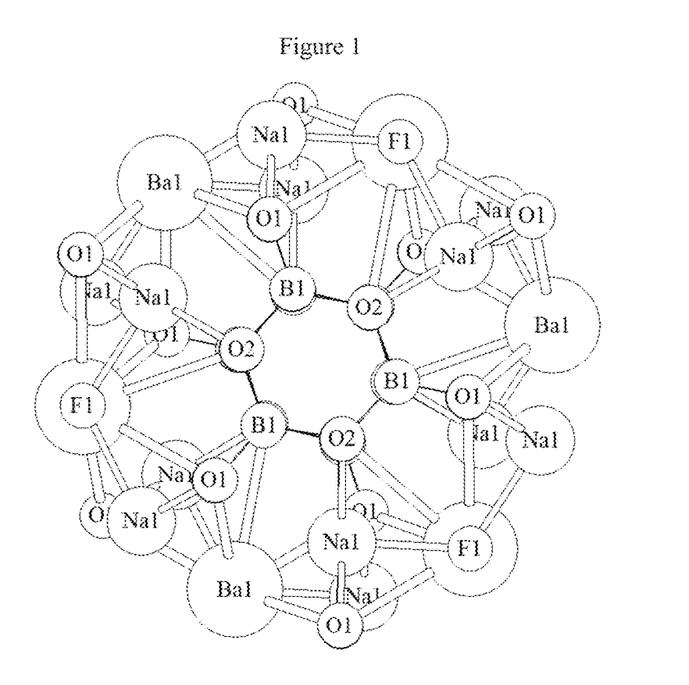
FIG. 1 shows a structural representation of the $Na_3Ba_2(B_3O_6)_2F$ birefringent crystal.

FIG. 1 shows a structural representation of the $Na_3Ba_2(B_3O_6)_2F$ sodium barium fluoborate birefringent crystal, wherein the basic unit of the crystal structure is $B_3O_6$ which constitutes parallel $B_3O_6$ layers, and Na, Ba and F are intercalated between the layers, so that a three-dimensional net structure is formed.

Figure 2:
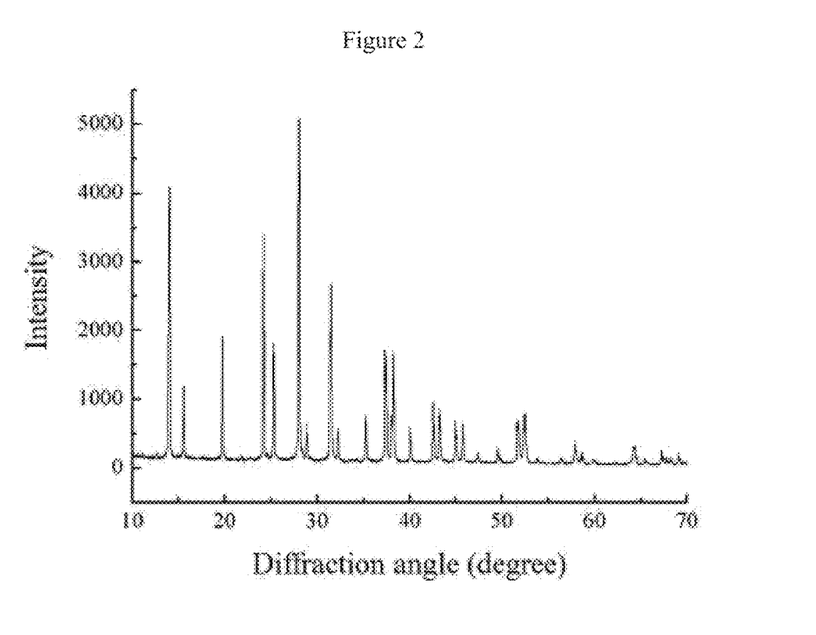
FIG. 2 shows an X-ray diffraction pattern of the powder of the $Na_3Ba_2(B_3O_6)_2F$ birefringent crystal.

FIG. 2 shows an X-ray diffraction pattern of the powder of the $Na_3Ba_2(B_3O_6)_2F$ sodium barium fluoborate birefringent crystal. As shown in the figure, the diffraction peaks are sharp and symmetrical, and high in intensity.

Figure 3:
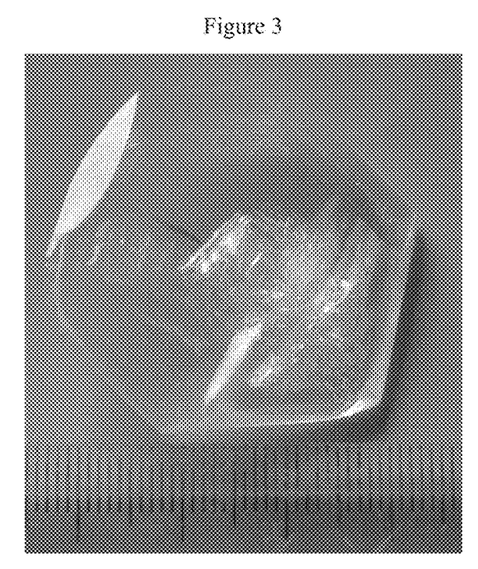
FIG. 3 shows a schematic illustration of the large-size transparent as-grown $Na_3Ba_2(B_3O_6)_2F$ birefringent crystal in the invention.

FIG. 3 shows the schematic illustration of the large-size transparent $Na_3Ba_2(B_3O_6)_2F$ birefringent crystal, which is transparent and of high quality, without cracks.

Example 13

Figure 4:
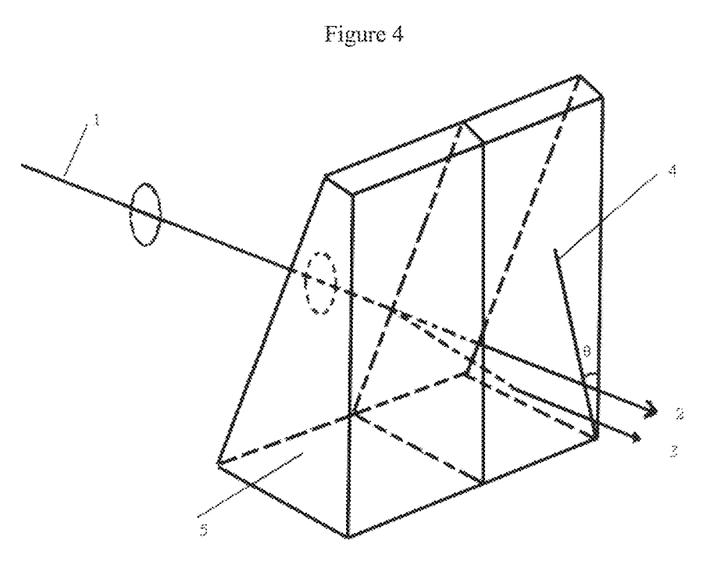
FIG. 4 shows a schematic illustration of a birefringent crystal wedge for polarization beam splitter made from the as-grown crystal according to the method of the invention.

Any $Na_3Ba_2(B_3O_6)_2F$ crystal obtained in Examples 1-3 was used for preparing a birefringent crystal wedge for polarization beam splitter (as shown in FIG. 4), wherein a wedge birefringent crystal was oriented so that its optical axis was as shown in FIG. 4; after incident upon the crystal, a natural light beam 1 would be split into two linearly polarized light beams (linearly polarized light 2 and linearly polarized light 3), the greater the birefringence index, the farther the two light beams may be separated. θ in FIG. 4 is the angulus parietalis of the wedge birefringent crystal polarization beam splitter.

Example 14

Figure 5A:
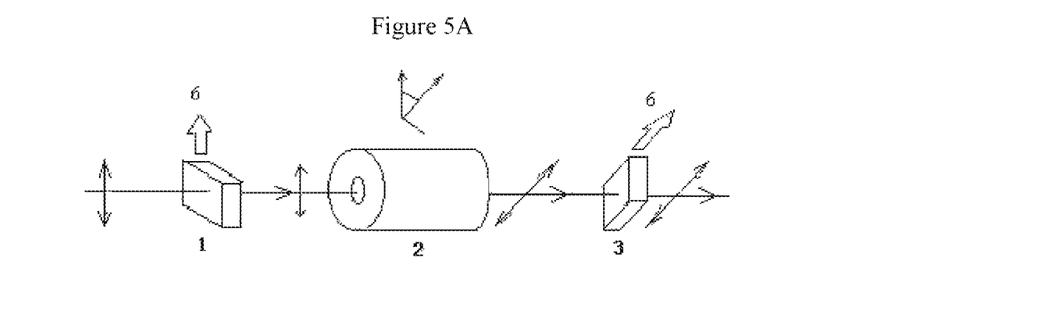
FIGS. 5A and 5B are schematic illustrations of optoisolators made from the as-grown crystal according to the method of the invention.
Figure 5B:
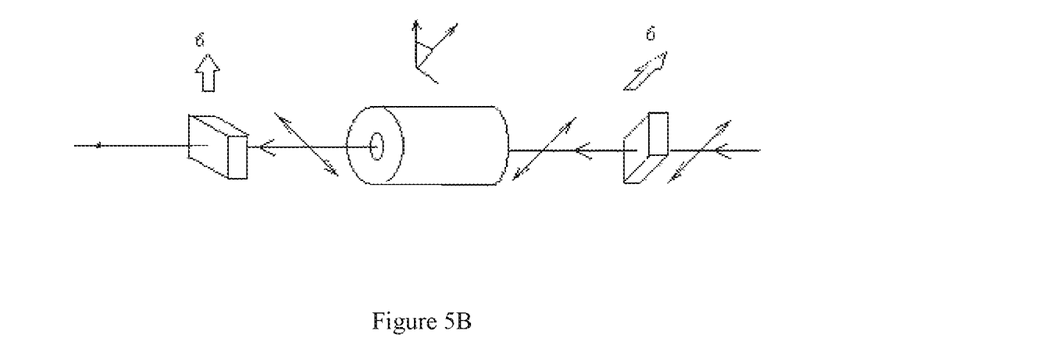

Any $Na_3Ba_2(B_3O_6)_2F$ crystal obtained in Examples 1-3 was used for preparing a optoisolator, wherein a Faraday optical rotator with an incident light beam polarization plane rotated by 45° was configured between a pair of birefringent crystal deflectors (1 and 3) which were arranged crosswise at an angle of 45°, and therefore an optoisolator was constituted. The optoisolator only allowed forward-propagating light beams to pass through the system but blocked the back-propagating light beams. FIG. 5A shows that the incident light can get through, while FIG. 5B shows that the reflected light is blocked.

Example 15

Figures 6A, 6B:
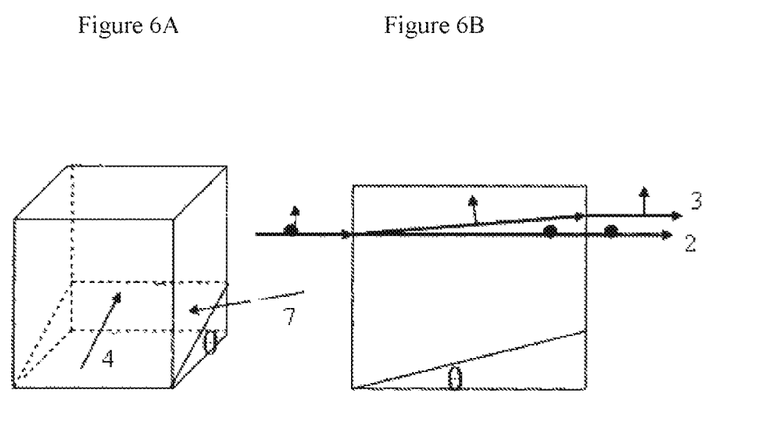
FIGS. 6A and 6B show a schematic illustration of a beam shifter made from the as-grown crystal according to the method of the invention.

Any $Na_3Ba_2(B_3O_6)_2F$ crystal obtained in Examples 1-3 was used for preparing a beam shifter. A birefringent crystal was processed so that its optic-axial plane formed an Angle θ with the arris (as shown in FIG. 6A). Upon perpendicular incidence, the natural light may be split into two linearly polarized light beams having perpendicular vibration directions (as shown in FIG. 6B), that is, o-ray and e-ray, the greater the birefringence index, the farther the two light beams may be separated, which facilitates beam splitting.

The invention claimed is:

1. A method for preparing sodium barium fluoborate birefringent crystal, characterized in that said crystal is grown by melt method including the top seeding method, the Kyropoulos method or the Czochralski method, according to the specific steps as follows:
   a. mixing and grinding a sodium-containing compound, barium-containing compound, boron-containing compound and fluorine-containing compound at a molar ratio of sodium:barium:boron:fluorine=3:2:6:1 to provide a mixture, charging the mixture into a platinum crucible, heating the mixture to a temperature higher than 820° C. to obtain a high-temperature mixed melt, and maintaining this temperature for 1-100 hours;

b. growing the crystal on the surface of or inside the mixed melt: decreasing the temperature of the mixed melt of Step (a) to 820-825° C., fixing a seed crystal to a seed crystal rod and preheating the seed crystal above the mixed melt for 1-100 minutes, then decreasing the temperature of the mixed melt to 810-820° C., descending the seed crystal onto the surface of or into the mixed melt while rotating the seed crystal or the crucible at a rotation speed of greater than 0 to 100 r/min, increasing or decreasing the temperature of the mixed melt at a rate of greater than 0 to 5° C./d, and meanwhile drawing the crystal at a drawing speed of greater than 0 to 15 mm/h;

c. when growing the crystal to a desired size, increasing the drawing speed so as to draw the crystal out of the surface of the mixed melt, decreasing the temperature to room temperature at a rate of 1-100° C./h, and then taking the crystal out of the crucible to obtain a $Na_3Ba_2(B_3O_6)_2F$ birefringent crystal.

2. The method for preparing the sodium barium fluoborate birefringent crystal according to claim 1, characterized in that, in Step (a), said sodium-containing compound is 99.9% pure sodium oxide, sodium hydroxide, sodium carbonate, sodium nitrate or sodium metaborate; said barium-containing compound is 99.9% pure barium oxide, barium hydroxide, barium fluoride, barium carbonate or barium nitrate; said boron-containing compound is 99.9% pure boric acid or boron oxide; and said fluorine-containing compound is 99.9% pure sodium fluoride or barium fluoride.

3. The method for preparing the sodium barium fluoborate birefringent crystal according to claim 1, characterized in that the sodium barium fluoborate birefringent crystal obtained by said method is a negative uniaxial crystal, $n_e<n_o$, having a birefringence index of 0.090-0.240 and a transmission range of 175-3,350 nm.

* * * * *